(12) United States Patent
Lee

(10) Patent No.: US 8,884,693 B2
(45) Date of Patent: Nov. 11, 2014

(54) AMPLIFIER AND FILTER HAVING VARIABLE GAIN AND CUTOFF FREQUENCY CONTROLLED LOGARITHMICALLY ACCORDING TO DIGITAL CODE

(71) Applicant: Samsung Electronics Co. Ltd., Suwon-si (KR)

(72) Inventor: Jong-Woo Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 74 days.

(21) Appl. No.: 13/713,582

(22) Filed: Dec. 13, 2012

(65) Prior Publication Data

US 2013/0154738 A1 Jun. 20, 2013

(30) Foreign Application Priority Data

Dec. 16, 2011 (KR) .................. 10-2011-0136712

(51) Int. Cl.
*H03G 3/20* (2006.01)
*H03G 3/00* (2006.01)
*H03G 1/00* (2006.01)

(52) U.S. Cl.
CPC ............ *H03G 3/002* (2013.01); *H03G 1/0088* (2013.01); *H03G 3/001* (2013.01)
USPC ............................................ 330/86; 330/144

(58) Field of Classification Search
USPC ..................... 330/86, 144, 282, 284
See application file for complete search history.

(56) References Cited

U.S. PATENT DOCUMENTS

| 7,417,499 B2 * | 8/2008 | Moon et al. ............... 330/86 |
| 2003/0058048 A1 | 3/2003 | Ueno et al. |
| 2007/0296490 A1 | 12/2007 | Elwan et al. |
| 2008/0197924 A1 | 8/2008 | Oishi |
| 2009/0039955 A1 | 2/2009 | Hosoya |

FOREIGN PATENT DOCUMENTS

KR   10-2012-0010378 A    2/2012

* cited by examiner

*Primary Examiner* — Steven J Mottola
(74) *Attorney, Agent, or Firm* — Jefferson IP Law, LLP

(57) ABSTRACT

A variable gain amplifier circuit is provided. The circuit includes an operational amplifier for amplifying and outputting an input signal according to a cutoff frequency and a gain, a feedback resistor for changing a first resistance according to a first digital control code value which determines the cutoff frequency, and an input resistor for changing a second resistance according to a second digital control code value which is determined based on a difference of the first digital control code value and a gain code value. The gain is determined by a ratio of the first resistance and the second resistance and linearly changes on a decibel (dB) basis according to the first digital control code value, the cutoff frequency is inversely proportional to the first resistance and linearly changes on a log scale, and the variable gain can be easily set using the control code.

18 Claims, 7 Drawing Sheets

AMPLIFIER AND FILTER HAVING VARIABLE GAIN AND CUTOFF FREQUENCY CONTROLLED LOGARITHMICALLY ACCORDING TO DIGITAL CODE

PRIORITY

The present application claims the benefit under 35 U.S.C. §119(a) of a Korean patent application filed on Dec. 16, 2011 in the Korean Intellectual Property Office and assigned Serial No. 10-2011-0136712, the entire disclosure of which is hereby incorporated by reference.

BACKGROUND OF THE INVENTION

1. Field of the Invention

The present invention relates to an analog amplifier and an analog filter for amplifying an analog signal. More particularly, the present invention relates to an amplifier and a filter for logarithmically controlling a variable gain and a cutoff frequency according to a digital control code.

2. Description of the Related Art

FIG. 1 depicts an analog filter structure according to the related art.

Referring to FIG. 1, the analog filter is constructed by coupling a plurality of first or higher order filter stages 100 (e.g., Stage 1, Stage 2, . . . , Stage n). A highpass feedback stage 110 is coupled between a first amplifier stage and an (n−1)-th amplifier stage, to cancel noise in a Direct Current (DC) component and remove a DC offset.

Although not illustrated, each filter stage 100 includes an operational amplifier, a variable resistor, and a variable capacitor. A gain and a cutoff frequency are controlled by the variable resistor and the variable capacitor. That is, the gain of each filter stage 100 is determined by a ratio of an input resistance and a feedback resistance, and the cutoff frequency is determined in inverse proportion to a product of the feedback resistor and the feedback capacitor.

The variable resistor of the filter stage 100 includes two or more segments which combine short-circuit switches and resistors. The short-circuit switch is controlled by a digital code K. A resistor serial connection controlled digitally is in a binary structure such as 2R, 4R, 8R, 16R, . . . , 2nR (n is an integer), and a total resistance is linearly proportional to the digital code. The resistance of the variable resistors linearly changes according to the digital code K, and the cutoff frequency is proportional to a reciprocal of the resistance.

In a frequency domain, a frequency axis is typically represented on a log scale and a decibel (dB) unit indicating the gain is a log scale value. Accordingly, the variable resistance which linearly varies according to the digital code K has non linearity in the log domain. However, such non linearity degrades efficiency.

That is, as the digital code K decreases, the variable resistance rapidly changes on the log scale. By contrast, as the digital code K increases, the variable resistance slowly changes on the log scale. This degrades not only the efficiency but also the accuracy of the variable resistance in a high frequency band as shown in FIG. 2, and thus results in uncontrollable sections.

FIG. 2 is a graph showing a relationship of frequency and gain according to the related art.

Referring to FIG. 2, as the digital code K increases, the variable resistance slowly changes on the log scale. By contrast, as the digital code K decreases, the variable resistance rapidly changes on the log scale. As a result, an uncontrollable section of the cutoff frequency is generated.

When frequency variation is measured per digital code, the variation is jagged because of a quantization error in each variation section as shown in FIG. 3. Hence, the uncontrollable section arises even when the frequency axis is regarded linearly, rather than using the log scale.

FIG. 3 is a graph of a relationship of a digital control code and frequency according to the related art.

Referring to FIG. 3, because it is not easy to set the cutoff frequency and the gain using the dB, a complicated digital logic circuit is required to logarithmically convert the linear digital code if necessary.

For example, to control the gain on a 3 dB basis, when the variable resistance is set to 500, 707, 1000, and 1414, and the digital code value K of 0, 1, 2, and 3 (representable with 2 bits) is given for the four resistance values respectively, a logic circuit is required to convert the value K to logarithmic digital codes of 5, 7, 10 and 14, which are approximate values. Since the approximate value is subject to considerable error, the implementation increases the number of bits from 2 bits to 4 bits. If an additional reduction in error is desired, an additional increase in the number of bits is required.

To implement the digital logic, a relatively simple method converts the value using a Read Only Memory (ROM). However, when the cutoff frequency and the gain are converted at the same time, the combination increases geometrically and it is not easy to realize the method with a simple equation.

Therefore, a need exists for a filter and an amplifier for simply controlling the variable gain and the cutoff frequency logarithmically according to the digital code.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a variable resistance circuit for easily setting a variable gain using a digital control code, and a variable gain amplifier circuit.

Another aspect of the present invention is to provide a variable resistance and variable gain amplifier for easily defining a gain according to a difference of control codes of variable resistances when the variable gain amplifier includes a plurality of variable resistors.

Yet another aspect of the present invention is to provide a variable resistance and variable cutoff frequency filter circuit for precisely defining a cutoff frequency of the variable cutoff frequency filter even in a high frequency band frequently used.

Still another aspect of the present invention is to provide an efficient analog circuit for processing a variable gain on a decibel (dB) basis or processing a log value of a cutoff frequency.

A further aspect of the present invention is to provide a variable resistance circuit for increasing a resistance logarithmically according to an increasing control code.

A further aspect of the present invention is to provide an apparatus and a method of a variable resistance circuit for minimizing an error caused by quantization of a gain of a variable gain amplifier regardless of a frequency band.

According to an aspect of the present invention, a variable gain amplifier circuit is provided. The circuit includes an operational amplifier for amplifying and outputting an input signal according to a cutoff frequency and a gain, a feedback resistor for changing a first resistance according to a first digital control code value which determines the cutoff frequency, and an input resistor for changing a second resistance according to a second digital control code value which is determined based on a difference of the first digital control code value and a gain code value. The gain is determined by a ratio of the first resistance and the second resistance and linearly changes on a dB basis according to the first digital control code value, and the cutoff frequency is inversely proportional to the first resistance and linearly changes on a log scale.

According to another aspect of the present invention, a variable gain amplifier circuit is provided. The circuit includes a logic circuit for applying an AND operation and a NOT operation to a first digital control code for determining a cutoff frequency and a second digital control code determined based on a difference of the first digital control code and a gain code value, a feedback resistor for changing a first resistance according to the first digital control code value, an input resistor for changing a second resistance according to the second digital control code value, and an operational amplifier for amplifying and outputting an input signal according to the cutoff frequency and a gain. The gain is determined by a ratio of the first resistance and the second resistance and linearly changes on a dB basis according to the first digital control code value, and the cutoff frequency is inversely proportional to the first resistance and linearly changes on a log scale.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention provide an apparatus and a method for an amplifier and a filter having a gain and a cutoff frequency controlled logarithmically according to a digital control code.

Figure 1:
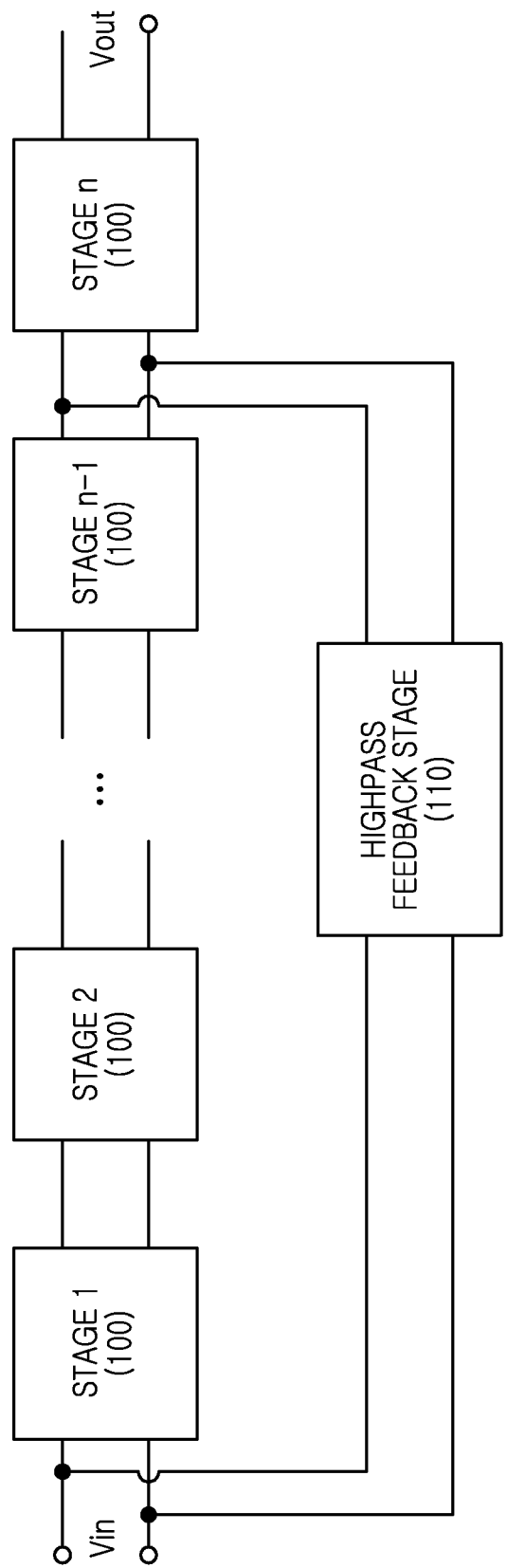
FIG. 1 is a diagram of an analog filter structure according to the related art.
Figure 2:
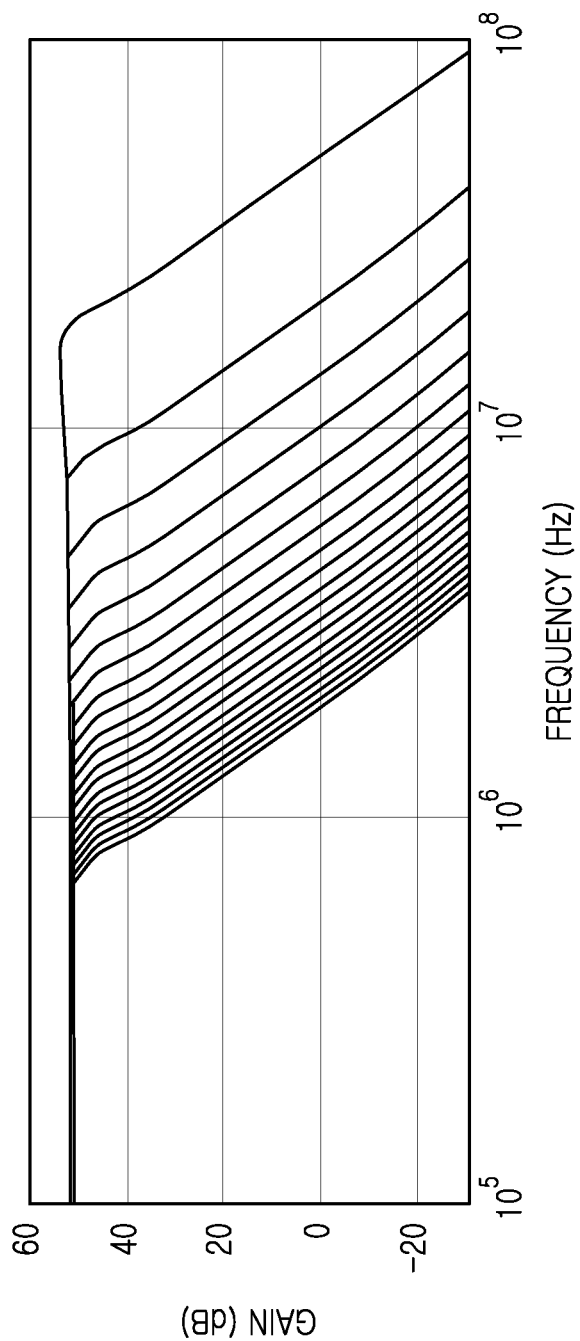
FIG. 2 is a graph of a relationship of frequency and gain according to the related art.
Figure 3:
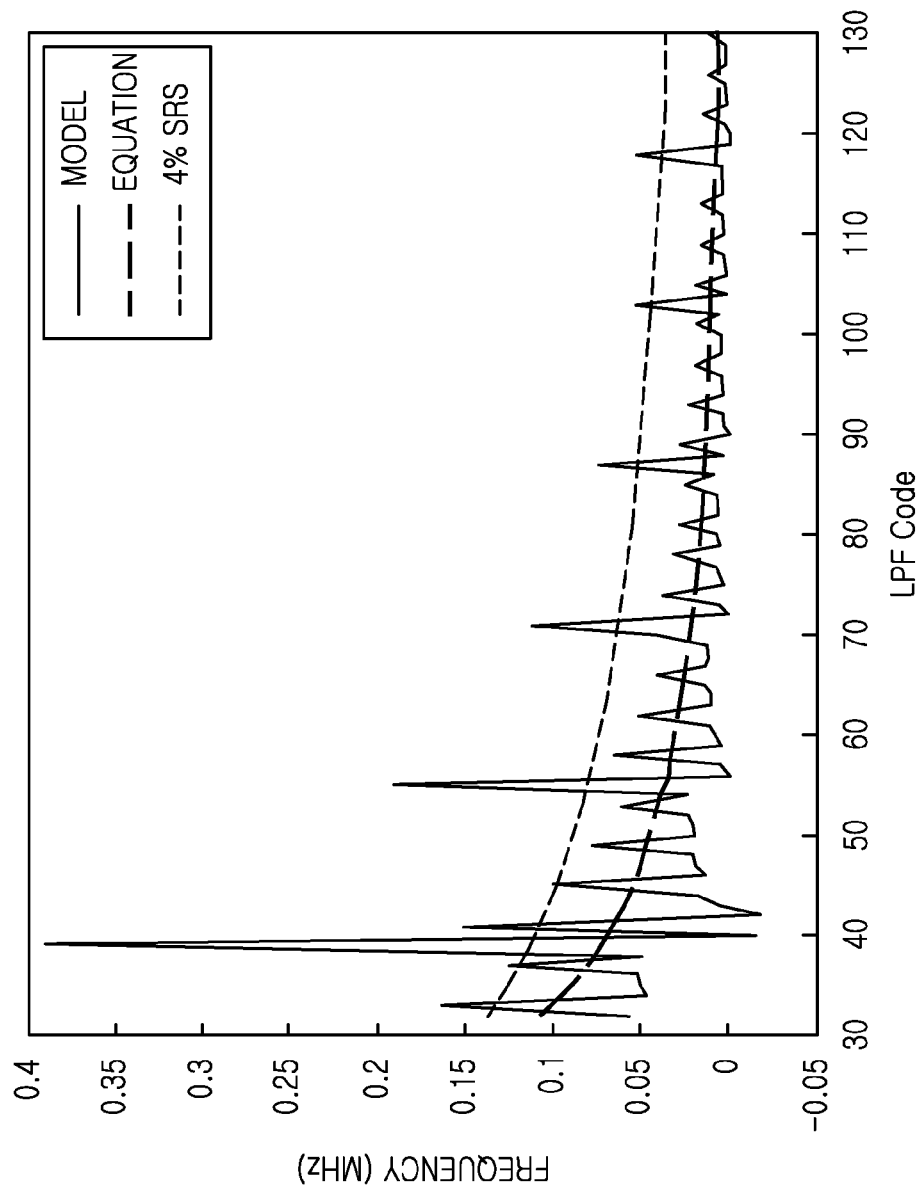
FIG. 3 is a graph of a relationship of a digital control code and frequency according to the related art.
Figure 4:
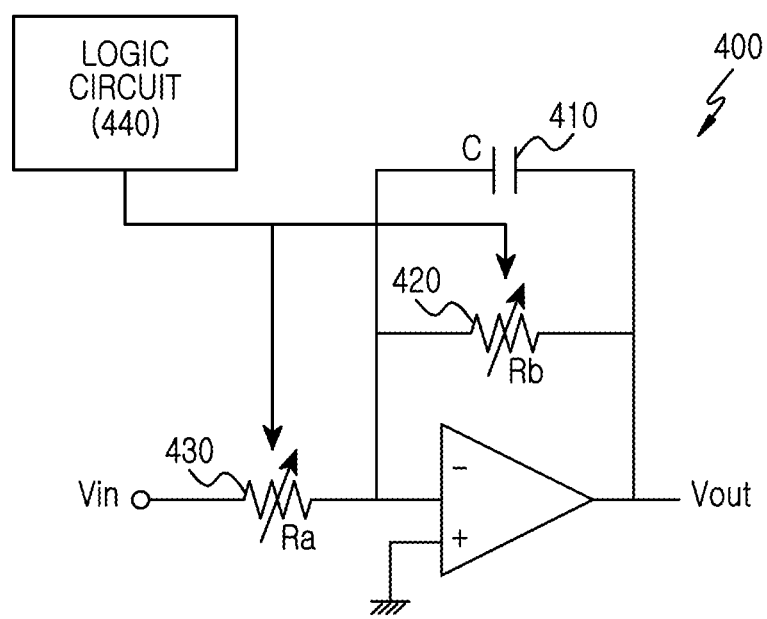
FIG. 4 is a diagram of an amplifier using a variable resistor according to an exemplary embodiment of the present invention.

FIG. 4 is a diagram of an amplifier using a variable resistor according to an exemplary embodiment of the present invention.

Referring to FIG. 4, the amplifier 400 can alter a gain and a cutoff frequency by changing resistances of variable resistors 420 and 430 as controlled by a logic circuit 440.

The gain and the cutoff frequency in a direct current of the amplifier 400 are defined based on Equation 1.

$$\text{Gain} = \frac{R_b}{R_a}, \qquad (1)$$

$$f_c = \frac{1}{2\pi R_b C}$$

In Equation 1, $R_a$ denotes an input variable resistance 430, $R_b$ denotes a feedback variable resistance 420, and C denotes a feedback capacitor 410.

To linearly change the cutoff frequency in decibels (dB) on a log scale with a constant gain value, an exemplary process is as follows. An ideal resistance of the feedback variable resistor 420 for obtaining an intended cutoff frequency is determined, and a value close to the ideal resistance, among values of the feedback variable resistor 420, is determined and set to $R_b$. An ideal resistance of the input variable resistor 430 for maintaining the constant gain is determined, and a value closest to the ideal resistance, among values of the input variable resistor 430, is determined and set to $R_a$.

Figure 5:
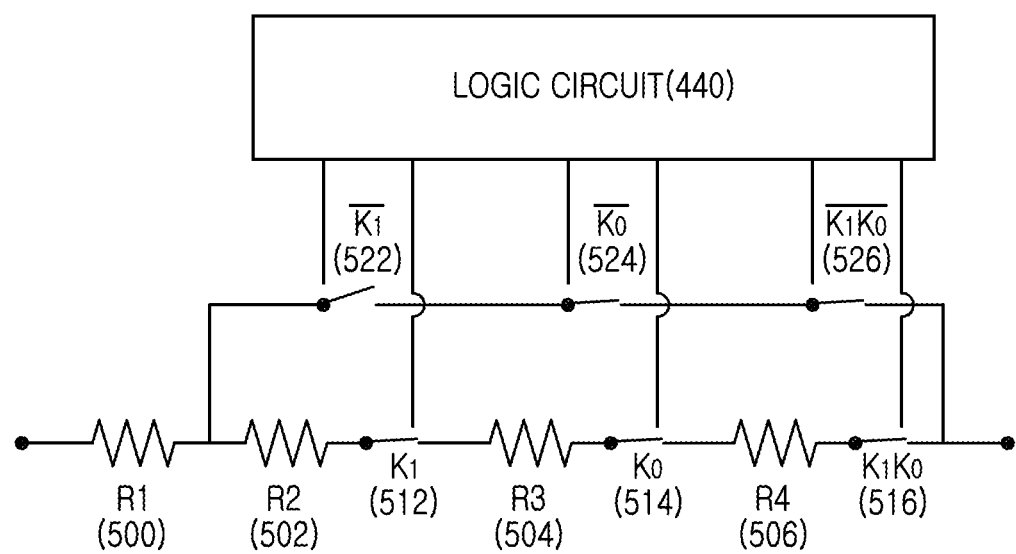
FIG. 5 is a circuit diagram of variable resistors according to an exemplary embodiment of the present invention.

FIG. 5 is a circuit diagram of variable resistors according to an exemplary embodiment of the present invention.

Referring to FIG. 5, a first resistor segment 500 and second resistor segments 502, 504, and 506 are connected in series, the second resistor segments 502, 504, and 506 are connected with first switches 522, 524, and 526 in parallel, and second switches 512, 514, and 516 are connected in series.

The resistances of the variable resistors 420 and 430 of FIG. 4 are controlled by 2-bit control signals b0 and b1. However, it is to be understood that the number of the control bits is not limited by this description of the present invention. The variable resistors 420 and 430 include the first resistor segment 500, the second resistor segments 502, 504, and 506, the first switches 522, 524, and 526 connected with the second resistor segments 502, 504, and 506 in parallel and changing the connection of at least one of the second resistor segments 502, 504, and 506 according to the 2-bit control signal, and the second switches 512, 514, and 516 connected with the second resistor segments 502, 504, and 506 in series. The control signal applied to the first switches 522, 524, and 526 is complementary to the control signal applied to the second switches 512, 514, and 516. Accordingly, depending on the control signal, one of the first switch 522 and the second switch 512 is closed and the other is opened for the R2 502.

The resistances of the variable resistors 420 and 430 can be expressed using an exponential function for the integer (i.e., the control code) k, which is combined with the 2-bit control signal. For example, a relational expression can be given by Equation 2.

$$R = R_{lsb} \times 2^{\frac{k}{2^N}} \quad (2)$$

As the control code k increases, the total resistance R of the variable resistor logarithmically increases and a reference resistance is $R_{lsb}$. N denotes a bit size of the control code. For example, $N=2(k_1k_0)$ in FIG. 5.

An exemplary adjustment of the variable resistance is explained by referring to FIG. 5.

Since only one of the first switches 522, 524, and 526 or the second switches 512, 514, and 516 is closed for the second resistor segments 502, 504, and 506, the number of the switches connected to the ends of the variable resistors 420 and 430 is fixed to 3 regardless of the control code k. For example, when $k=0$ ($k_1k_0=00$), three switches 522, 524, and 526 are closed. When $k=1$ ($k_1k_0=01$), three switches 522, 514, and 526 are closed. When $k=2$ ($k_1k_0=10$), three switches 512, 524, and 526 are closed. When $k=3$ ($k_1k_0=11$), three switches 512, 514, and 516 are closed.

For example, when the resistances R1, R2, R3, R4 are set to 500, 500, 207, and 207 respectively in order to attain the variable gain on the 3 dB basis, and the variable resistances are 500, 707 (=500+207), 1000 (500+500), and 1414 (500+500+207+207), unlike the method of the related art, the digital control code value k can directly control the variable gain and the cutoff frequency without a complicated digital logic circuit and just one AND logic is added for the $k_1k_0$ operation. In addition, the actual resistance is not subject to the quantization error of the system as in the conventional method, and the logarithmical variable resistor can be simply implemented without additional bits.

As stated above, while the total resistance R of the variable resistor logarithmically increases as the control code k ($k_1k_0$) increases in FIG. 5, the total resistance R of the variable resistor may logarithmically increase as the control code k decreases according to the switch and logic circuit 440 configuration. Those skilled in the art shall appreciate that such a modification is within the spirit and scope of the present invention.

When the feedback variable resistance $R_b$ 420 of FIG. 4 is determined by the digital control code $k_1k_0$ in the variable resistor structure of FIG. 5 and the cutoff frequency for the amplifier of FIG. 4 is determined, the input variable resistance $R_a$ 430 needs to be determined to determine the 3 dB gain corresponding to the determined cutoff frequency. Similarly, like the feedback variable resistance $R_b$ 420, the input variable resistance $R_a$ 430 is determined by the digital control code $k_1k_0$ in the variable resistor of FIG. 5.

To simplify the complicated determination for the gain, exemplary embodiments of the present invention provide a method for determining the gain using simple addition based on a difference between the digital control code for determining the feedback variable resistance $R_b$ (hereafter, referred to as a first digital control code) and the digital control code for determining the input variable resistance $R_a$ (hereafter, referred to as a second digital control code), which is given by Equations 3, 4 and 5.

$$Code2 = K$$

$$Code1 = K - n \times Gain\_Code \quad (3)$$

In Equation 3, Code2 denotes the digital control code for determining the feedback variable resistance $R_b$, Code1 denotes the digital control code for determining the input variable resistance $R_a$, K denotes an integer value according to the digital control code size N (e.g., $n=1(=2^N/2)$ when $N=2$, $n=8(=2^N/2)$ when $N=4$, and $n=32(=2^N/2)$ when $N=6$), and Gain_Code denotes an integer from 1 to $2^N$.

For example, when Gain_Code=1, a gain of 3 dB is attained. When Gain_Code=2, a gain of 6 dB is attained. When Gain_Code=k, a gain of 3 dB*k is attained.

The feedback variable resistance and the input variable resistance are determined according to Code2 and Code1 based on Equation 4.

$$R_b = 2k \times 2^{\frac{Code\,2}{2^N}}, R_a = 2k \times 2^{\frac{Code\,1}{2^N}} \quad (4)$$

$R_b$ denotes the feedback variable resistance, $R_a$ denotes the input variable resistance, N denotes the digital control code size, and s is a constant.

The gain is determined in proportion to the two resistances based on Equation 5.

$$A_V = \frac{R_b}{R_a} = \frac{2k \times 2^{\frac{Code\,2}{2^N}}}{2k \times 2^{\frac{Code\,1}{2^N}}} = 2^{\frac{Gain\_Code}{2}} = 3 \text{ dB} \times Gain\_Code \quad (5)$$

Since the gain $A_V$ is proportional to the two resistances, the 3 dB operation is determined according to the value of Gain_Code.

For example, when N=6 bits, K=64, and Gain_Code=1 (the 3 dB gain), Code1 is 64 and Code2 is 32 (=64−32*1). At this time, the gain is $$A_V = \frac{2k \times 2^{\frac{64}{64}}}{2k \times 2^{\frac{32}{64}}} = 2^{\frac{1}{2}} = 3 \text{ dB}.$$

Herein, 32 is multiplied to determine Code1, whereas the actual logic merely shifts the value by 5 bits.

Figure 6:
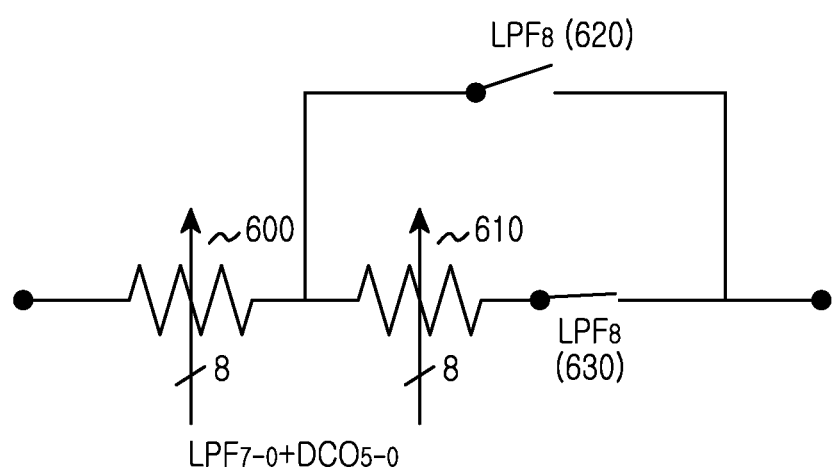
FIG. 6 is a diagram of part of a variable resistor controlled by an 8-bit digital control code according to an exemplary embodiment of the present invention.

In the above exemplary implementations, the simple logic facilitates the exponential resistance change, and thus an exemplary circuit for finely correcting the error of the differential resistances can be configured as shown in FIG. 6.

FIG. 6 depicts part of the variable resistor controlled according to the 8-bit digital control code according to an exemplary embodiment of the present invention.

The variable resistor controlled according to the 8-bit digital control code can be configured by expanding the 2-bit variable resistor of FIG. 5. For example, the variable resistor controlled by the 8-bit digital control code can successively couple three or four 2-bit variable resistors of FIG. 5.

Referring to FIG. 6, in part of the variable resistor controlled by the 8-bit digital control code, the error between the differential resistances can be corrected by differently controlling two segments 600 and 610 and adding an adequate digital correction value DCO only to the former segment 600. For example, a 6-bit correction control code $DCO_{5-0}$ is added to the 8-bit digital control code $LPF_{7-0}$ of the segment 600. Switches 620 and 630 are turned on and off according to the eighth bit of the digital control code.

Herein, when a common voltage of the differential resistances is $V_{CM}$ and an error between the differential resistances is $\Delta R$, a DC error is given by Equation 6.

$$V_{DC} = \frac{V_{CM}}{R_1} \Delta R \tag{6}$$

In the 8-bit expanded variable resistor of FIG. 6, the change of the value R according to the code change is given by Equation 7.

$$\Delta R = 2k \times \left( 2^{\frac{Code+DCO}{64}-4} - 2^{\frac{Code}{64}} \right) \tag{7}$$

In Equation 7, s is a constant, Code denotes the code value, and DCO denotes the correction value.

Hence, the correction value of the DC error according to the DCO change is given by Equation 8.

$$V_{DC} = \frac{V_{CM}}{16} \times \left( 2^{\frac{DCO}{64}} - 1 \right) = DCO \times 0.4 \text{ mV} \tag{8}$$

That is, every 0.4 mV is corrected according to the digital correction value DCO code change.

Figure 7:
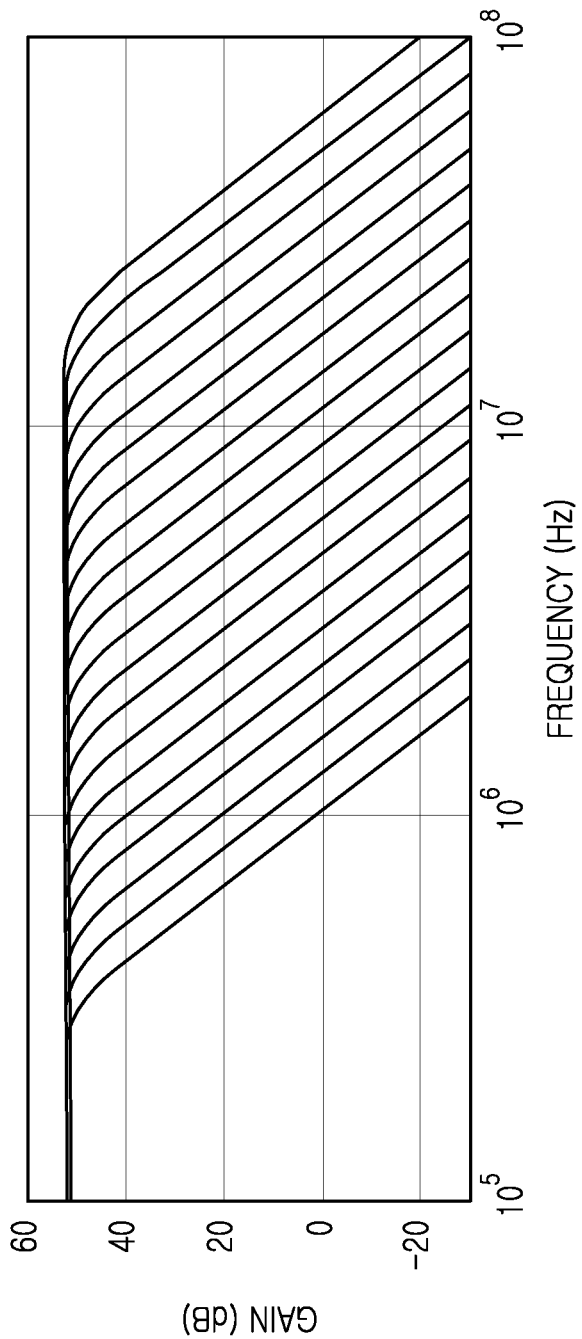
FIG. 7 is a graph of frequency, gain, and a digital control code K according to an exemplary embodiment of the present invention.

FIG. 7 is a graph of frequency, gain, and digital control code K according to an exemplary embodiment of the present invention.

Referring to FIG. 7, regular intervals can be maintained on the log scale by logarithmically controlling the cutoff frequency and the gain according to the digital control code K. This enhances not only the system efficiency but also the filter performance by finely controlling the cutoff frequency.

As set forth above, the error caused by the quantization of the gain of the variable gain amplifier can be minimized regardless of the frequency band. The variable gain can be easily set using the control code. In addition, when the variable gain amplifier is implemented using a plurality of variable resistors, the variable resistance and variable gain amplifier can simply define the gain according to the difference of the control codes of the variable resistors.

Since a complicated logic circuit used to obtain the approximate value in the conventional binary variable resistor is unnecessary, a digital controller can be simplified, the total circuit area can be reduced to lower the circuit cost, and a noise generated in the digital logic circuit is remarkably reduced to thus improve the amplifier performance.

Further, exemplary embodiments of the present invention can provide the variable resistance and variable cutoff frequency filter circuit for finely defining the cutoff frequency of the variable cutoff frequency filter even in the high frequency band which is frequently used.

Moreover, an exemplary analog circuit can process the variable gain on the decibel (dB) basis or process the log value of the cutoff frequency more efficiently.

As the control code increases, the variable resistance circuit can logarithmically increase the resistance.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A variable gain amplifier circuit comprising:
    an operational amplifier for amplifying and outputting an input signal according to a cutoff frequency and a gain;
    a feedback resistor for changing a first resistance according to a first digital control code value which determines the cutoff frequency; and
    an input resistor for changing a second resistance according to a second digital control code value which is determined based on a difference of the first digital control code value and a gain code value,
    wherein the gain is determined by a ratio of the first resistance and the second resistance and linearly changes on a decibel (dB) basis according to the first digital control code value, and
    wherein the cutoff frequency is inversely proportional to the first resistance and linearly changes on a log scale.

2. The variable gain amplifier circuit of claim 1, wherein the gain is determined by and proportional to a difference of the first digital control code value and the second digital control code value on the dB basis.

3. The variable gain amplifier circuit of claim 1, further comprising:
    a feedback capacitor connected between an input stage and an output stage of the operational amplifier.

4. The variable gain amplifier circuit of claim 1, further comprising:
    a logic circuit for applying an AND operation and a NOT operation to bit values corresponding to the first digital control code or the second digital control code.

5. The variable gain amplifier circuit of claim 1, wherein a sum of the first digital control code for controlling the cutoff frequency, and a third digital control code for determining a quality factor which determines a performance of a filter function determines the quality factor.

6. The variable gain amplifier circuit of claim 1, wherein the second digital control code value is determined based on the following equation:

Code2=K

Code1=K−n*Gain_Code where Code2 denotes a digital control code for determining the feedback resistor, Code1 denotes a digital control code for the input resistor, K denotes an integer according to a digital control code size N, Gain_Code denotes an integer for determining the gain, and n denotes an integer determined by the digital control code size N.

7. The variable gain amplifier circuit of claim 1, wherein the feedback resistor comprises:
- a first resistor segment;
- a plurality of second resistor segments connected to the first resistor segment in series;
- a first switch connected to both ends of the second resistor segments and controlled by the first control code; and
- a second switch connected to the second resistor segments in series and controlled by an inverse signal of the first control code.

8. The variable gain amplifier circuit of claim 7, wherein the first resistance controlled by the first digital control code is determined based on a geometric progression of resistances corresponding to the first resistor segment and the second resistor segments.

9. The variable gain amplifier circuit of claim 7, further comprising:
- a logic circuit for correcting an error of differential resistances by adding an additional digital control code value to part of the segments of the feedback resistor.

10. The variable gain amplifier circuit of claim 1, wherein the input resistor comprises:
- a first resistor segment;
- a plurality of second resistor segments connected to the first resistor segment in series;
- a first switch connected to both ends of the second resistor segments and controlled by the second control code; and
- a second switch connected to the second resistor segments in series and controlled by an inverse signal of the second control code.

11. The variable gain amplifier circuit of claim 10, wherein the second resistance controlled by the second digital control code is determined based on a geometric progression of resistances corresponding to the first resistor segment and the second resistor segments.

12. The variable gain amplifier circuit of claim 10, further comprising:
- a logic circuit for correcting an error of differential resistances by adding an additional digital control code value to part of the segments of the input resistor.

13. A variable gain amplifier circuit comprising:
- a logic circuit for applying an AND operation and a NOT operation to a first digital control code for determining a cutoff frequency and a second digital control code determined based on a difference of the first digital control code and a gain code value;
- a feedback resistor for changing a first resistance according to the first digital control code value;
- an input resistor for changing a second resistance according to the second digital control code value; and
- an operational amplifier for amplifying and outputting an input signal according to the cutoff frequency and a gain,
- wherein the gain is determined by a ratio of the first resistance and the second resistance and linearly changes on a decibel (dB) basis according to the first digital control code value, and
- wherein the cutoff frequency is inversely proportional to the first resistance and linearly changes on a log scale.

14. The variable gain amplifier circuit of claim 13, wherein the gain is proportional on the dB basis based on a difference of the first digital control code and the second digital control code.

15. The variable gain amplifier circuit of claim 13, further comprising:
- a feedback capacitor connected between an input stage and an output stage of the operational amplifier.

16. The variable gain amplifier circuit of claim 13, wherein the feedback resistor or the input resistor comprises:
- a first resistor segment;
- a plurality of second resistor segments connected to the first resistor segment in series;
- a first switch connected to both ends of the second resistor segments and controlled by the first control code; and
- a second switch connected to the second resistor segments in series and controlled by an inverse signal of the first control code.

17. The variable gain amplifier circuit of claim 16, wherein the first resistance controlled by the first digital control code is determined based on a geometric progression of resistances corresponding to the first resistor segment and the second resistor segments.

18. The variable gain amplifier circuit of claim 13, further comprising:
- a logic circuit for correcting an error of differential resistances by adding an additional digital control code value to part of the segments of the feedback resistor.

* * * * *